United States Patent
Son et al.

(10) Patent No.: US 11,527,715 B2
(45) Date of Patent: Dec. 13, 2022

(54) METHOD FOR CONTROLLING CURRENT PATH BY USING ELECTRIC FIELD, AND ELECTRONIC ELEMENT

(71) Applicant: VMEMORY CORP., Suwon-si Gyeonggi-do (KR)

(72) Inventors: Jong Hwa Son, Yongin-si (KR); Jong Yeog Son, Hwaseong-si (KR)

(73) Assignee: VMEMORY CORP., Suwon-si Gyeonggi-do (KR)

( * ) Notice: Subject to any disclaimer, the term of this patent is extended or adjusted under 35 U.S.C. 154(b) by 0 days.

(21) Appl. No.: 17/284,106

(22) PCT Filed: Sep. 4, 2019

(86) PCT No.: PCT/KR2019/011361
§ 371 (c)(1),
(2) Date: Apr. 9, 2021

(87) PCT Pub. No.: WO2020/075972
PCT Pub. Date: Apr. 16, 2020

(65) Prior Publication Data
US 2021/0313426 A1 Oct. 7, 2021

(30) Foreign Application Priority Data
Oct. 12, 2018 (KR) .................. KR10-2018-0122047

(51) Int. Cl.
*H01L 45/00* (2006.01)
*G11C 13/00* (2006.01)

(52) U.S. Cl.
CPC ...... *H01L 45/1273* (2013.01); *G11C 13/0069* (2013.01); *H01L 45/10* (2013.01); *H01L 45/1233* (2013.01); *G11C 2013/0078* (2013.01)

(58) Field of Classification Search
CPC .................................................. H01L 45/1273
See application file for complete search history.

(56) References Cited

U.S. PATENT DOCUMENTS 7,405,418 B2 * 7/2008 Happ ...................... H01L 45/06
257/1
7,696,507 B2 * 4/2010 Khang .................. H01L 45/144
257/4
(Continued)

FOREIGN PATENT DOCUMENTS

CN 102696107 A * 9/2012 ............. C23C 28/00
CN 107636822 A 1/2018
(Continued)

OTHER PUBLICATIONS

International Search Report and Written Opinion dated Dec. 6, 2019 in International Patent Application No. PCT/KR2019/011361, filed Apr. 9, 2019, 9 pages.
(Continued)

*Primary Examiner* — Daniel Luke
(74) *Attorney, Agent, or Firm* — Kilpatrick Townsend & Stockton LLP

(57) ABSTRACT

Provided is an electronic device including a first electrode; a second electrode facing the first electrode; and an active layer between the first electrode and the second electrode, wherein at least one of the first electrode and the second electrode includes a first surface that is closest to the active layer and a second surface that is farthest from the active layer, a size of a cross-sectional horizontal area at the first surface is smaller than a size of a cross-sectional horizontal area at the second surface, the active layer includes a first region, which vertically overlaps the first surface, and a second region outside the first region, and a thickness of the active layer in the first region is smaller than a thickness of the active layer in the second region.

10 Claims, 11 Drawing Sheets

(56) References Cited

U.S. PATENT DOCUMENTS

| | | | |
|---|---|---|---|
| 7,732,799 B2* | 6/2010 | Lee | H01L 45/144 |
| | | | 257/4 |
| 8,598,561 B2* | 12/2013 | Sekine | H01L 45/16 |
| | | | 257/4 |
| 9,653,680 B2* | 5/2017 | Pillarisetty | H01L 45/08 |
| 2010/0128512 A1* | 5/2010 | Ohnishi | G11C 7/18 |
| | | | 365/145 |
| 2010/0288995 A1* | 11/2010 | Ozawa | H01L 45/1625 |
| | | | 257/4 |

FOREIGN PATENT DOCUMENTS

| | | |
|---|---|---|
| EP | 1326271 A1 | 7/2003 |
| JP | 11-289058 A | 10/1999 |
| JP | 2018-509777 A | 4/2018 |
| KR | 2010-0078140 A | 7/2010 |
| KR | 2016-0109555 A | 9/2016 |
| KR | 2018-0106663 A | 10/2018 |
| WO | 2004/107466 A1 | 12/2004 |
| WO | 2011/138941 A1 | 11/2011 |

OTHER PUBLICATIONS

Notice of Allowance dated Jun. 10, 2019 in Korean Patent Application No. 10-2018-0122047, filed Oct. 12, 2018, 3 pages.
Non-Final Office Action dated Feb. 14, 2019 in Korean Patent Application No. 10-2018-0122047, filed Oct. 12, 2018, 11 pages.

* cited by examiner

METHOD FOR CONTROLLING CURRENT PATH BY USING ELECTRIC FIELD, AND ELECTRONIC ELEMENT

TECHNICAL FIELD

Embodiments of the present disclosure relate to a method of controlling an electric current path using an electric field and an electronic device.

BACKGROUND ART

Along with developments in technologies and increasing interest on convenience of people, attempts to develop various electronic products are being actively made.

Also, such electronic products are more miniaturized and more integrated, and applications of such electronic products are increasing widely.

DESCRIPTION OF EMBODIMENTS

Technical Problem

Such electronic products include various electric devices and include, for example, CPUs, memories, and various other electrical devices. The electric devices may include various types of electric circuits.

For example, electric devices are used for products of various fields including a computer, a smart phone, a home sensor device for IoT, and a bio-electronic device for ergonomics.

Meanwhile, uses and application fields of such electric device are rapidly increasing according to the recent technological development speed and the rapid improvement of life level of users, demands of the electric devices are also increasing.

According to this trend, there is a limitation in implementing and controlling electric circuits that are easily and rapidly applicable to various electric devices that are frequently used.

Technical Solution

The present disclosure provides a method of controlling an electric current path and an electronic device which may be easily applied to various uses.

According to an aspect of the present disclosure, there is provided an electronic device including a first electrode; a second electrode facing the first electrode; and an active layer between the first electrode and the second electrode, wherein at least one of the first electrode and the second electrode includes a first surface that is closest to the active layer and a second surface that is farthest from the active layer, a size of a cross-sectional horizontal area at the first surface is smaller than a size of a cross-sectional horizontal area at the second surface, and the active layer includes a first region, which vertically overlaps the first surface, and a second region outside the first region, and a thickness of the active layer in the first region is smaller than a thickness of the active layer in the second region.

Advantageous Effects of Disclosure

A method of controlling an electric current path and an electronic device according to the present disclosure may be easily applied to various uses.

BEST MODE

Figure 1:
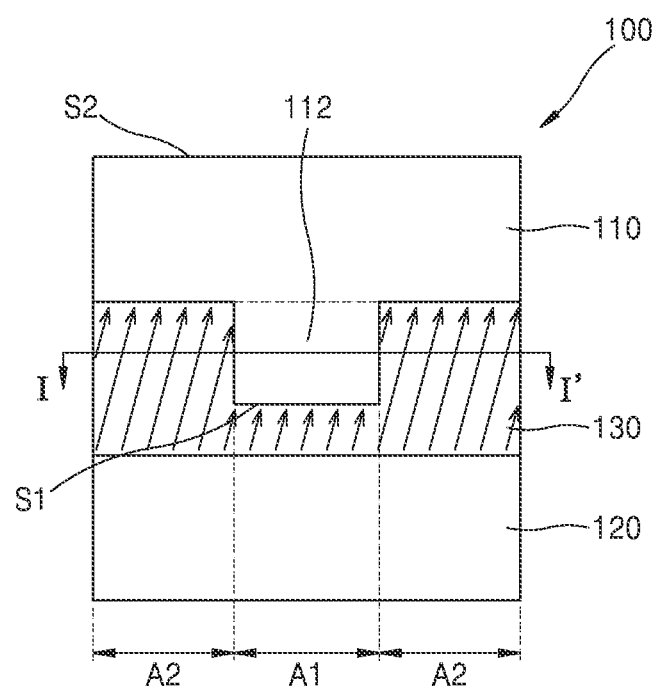
FIGS. 1 and 2 are schematic cross-sectional views of an electronic device according to an embodiment of the present disclosure.

According to an aspect of the present disclosure, there is provided an electronic device including a first electrode; a second electrode facing the first electrode; and an active layer between the first electrode and the second electrode, wherein at least one of the first electrode and the second electrode includes a first surface that is closest to the active layer and a second surface that is farthest from the active layer, a size of a cross-sectional horizontal area at the first surface is smaller than a size of a cross-sectional horizontal area at the second surface, and the active layer includes a first region, which vertically overlaps the first surface, and a second region outside the first region, and a thickness of the active layer in the first region is smaller than a thickness of the active layer in the second region.

According to the present embodiment, at least one of the first electrode and the second electrode may include at least one protrusion protruding in a direction toward the other electrode, and the size of the cross-sectional horizontal area at the first surface may be equal to an area of an end portion of the at least one protrusion.

According to the present embodiment, at least one of the first electrode and the second electrode may have a tapered shape.

According to the present embodiment, the active layer may be polarized in a first direction in the second region, and the first region may be selectively polarized in the first direction or a second direction different from the first direction due to an application of a voltage to the first electrode and the second electrode.

According to the present embodiment, a variable channel through which electrons move may be formed between the first region and the second region when the first region is polarized in the second direction.

According to the present embodiment, the variable channel may disappear when the first region is polarized in the first direction.

According to another aspect of the present disclosure, there is provided a method of controlling an electric current path by using an electric field in an electronic device including a first electrode and a second electrode facing each other; and an active layer, which is between the first electrode and the second electrode and polarized in a first direction, the method including generating a first electric field between the first electrode and the second electrode by applying a first voltage between the first electrode and the second electrode; dividing the active layer into a first region and a second region having different polarizations by changing a polarization direction of a portion of the active layer by using the first electric field; and forming a channel through which a current flows at a boundary between the first region and the second region, wherein at least one of the first electrode and the second electrode includes a first surface that is closest to the active layer and a second surface that is farthest from the active layer, and a size of a cross-sectional horizontal area at the first surface is smaller than a size of a cross-sectional horizontal area at the second surface, and the first region is a region overlapping the first surface in a vertical direction, and a thickness of the active layer in the first region is smaller than a thickness of the active layer in the second region.

According to the present embodiment, the channel may be formed as a shortest distance between the first electrode and the second electrode.

According to the present embodiment, when the first voltage is applied between the first electrode and the second electrode, the second region may maintain polarization in the first direction.

According to the present embodiment, the method may further include generating a second electric field between the first electrode and the second electrode by applying a second voltage for returning the polarization direction of the first region between the first electrode and the second electrode, wherein the channel may disappear as the second voltage is applied.

Mode of Disclosure

The present disclosure may include various embodiments and modifications, and embodiments thereof will be illustrated in the drawings and will be described herein in detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

It will be understood that although the terms "first", "second", etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Reference will now be made in detail to embodiments, examples of which are illustrated in the accompanying drawings. In the drawings, the same elements are denoted by the same reference numerals.

Figure 2:
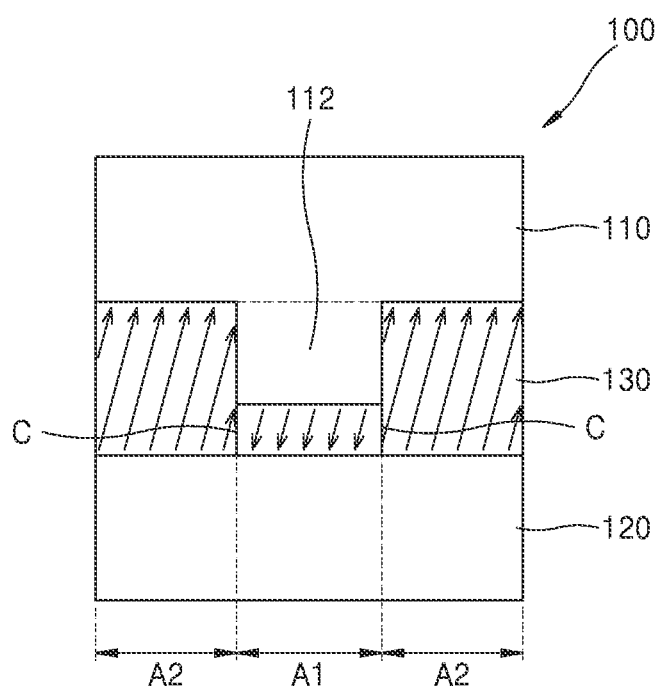

FIGS. 1 and 2 are schematic cross-sectional views of an electronic device according to an embodiment of the present disclosure.

Referring to FIGS. 1 and 2, an electronic device 100 according to an embodiment may include a first electrode 110, a second electrode 120 facing the first electrode 110, and an active layer 130 interposed between the first electrode 110 and the second electrode 120.

At least one of the first electrode 110 and the second electrode 120 includes a first surface S1 that is closest to the active layer 130 and a second surface S2 that is farthest from the active layer 130, and, in this case, a cross-sectional horizontal area of the first surface S1 may be smaller than a cross-sectional horizontal area of the second surface S2. For example, at least one of the first electrode 110 and the second electrode 120 may include at least one protrusion 112 protruding in a direction toward the other electrode.

Although FIGS. 1 and 2 show that the first electrode 110 includes one protrusion 112, the present disclosure is not limited thereto, and the protrusion 112 may be formed on the second electrode 120 or may be formed on both the first electrode 110 and the second electrode 120. Also, the protrusion 112 may be formed as a plurality of protrusions. The protrusion 112 may be formed as a single body with the first electrode 110.

The first electrode 110 and the second electrode 120 may include a metal, such as platinum, gold, aluminum, silver, or copper, a conductive polymer, such as PEDOT:PSS or polyaniline, or a metal oxide, such as an indium oxide (e.g., $In_2O_3$), a tin oxide (e.g., $SnO_2$), a zinc oxide (e.g., ZnO), an indium oxide-tin oxide alloy (e.g., $In_2O_3$—$SnO_2$), or an indium oxide-zinc oxide alloy (e.g., $In_2O_3$—ZnO).

The active layer 130 may include a self-polarizing material. For example, the active layer 130 may include an insulation material and a ferroelectric material. In other words, the active layer 130 may include a material having spontaneous electrical polarization (electrical dipole) that may be reversed when there is an electric field.

In some embodiments, the active layer 130 may include a perovskite-based material, e.g., $BaTiO_3$, $SrTiO_3$, $BiFe_3$, $PbTiO_3$, $PbZrO_3$, or $SrBi_2Ta_2O_9$.

In another example, the active layer 130 may have an ABX3 structure, wherein A may include at least one material selected from an alkyl group of CnH2n+1 and an inorganic material like Cs or Ru capable of forming a perovskite solar cell structure, B may include at least one material selected from a group consisting of Pb, Sn, Ti, Nb, Zr, and Ce, and X may include a halogen material. In detail, for example, the active layer 130 may include $CH_3NH_3PbI_3$, $CH_3NH_3PbI_xCl_{3-x}$, $MAPbI_3$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)$ $(HC(NH_2)_2)_{1-y}PbI_3$, $(CH_3NH_3)(HC(NH_2)_2)_{1-y}Pb I_xCl_{3-x}$, $(CH_3NH_3)(HC(NH_2)_2)_{1-y}Pb I_xBr_{3-x}$, or $(CH_3NH_3)(HC(NH_2)_2)_{1-y}PbCl_xBr_{3-x}$ ($0 \leq x, y \leq 1$).

The active layer 130 may exhibit self-induced polarization, and a degree and a direction of polarization may be controlled according to application of an electric field. Also, the active layer 130 may maintain a polarization state even when an applied electric field is removed.

Meanwhile, the active layer 130 may include a first region A1 vertically overlapping the first surface S1 and a second region A2 outside the first region A1. As described above, since the cross-sectional horizontal area of the first surface S1 closest to the active layer 130 is smaller than the cross-sectional horizontal area of the second surface S2, the thickness of the active layer 130 in the first region A1 vertically overlapping the first surface S1 may be smaller than the thickness of the active layer 130 in the second region A2.

As shown in FIG. 1, the active layer 130 may be polarized in a first direction. For example, both the first region A1 and the second region A2 may be polarized in the first direction. In this state, no current may flow between the first electrode 110 and the second electrode 120 due to the active layer 130.

However, when a first voltage higher than a coercive voltage at which charges of a hysteresis loop of the active layer 130 become 0 is applied to the first electrode 110 and the second electrode 120, as shown in FIG. 2, a polarization direction of the first region A1 may be changed by a first electric field generated between the first electrode 110 and the second electrode 120, and the active layer 130 may be divided into the first region A1 and the second region A2.

At this time, since the magnitude of a voltage for changing the polarization direction of the domain of the active layer 130 is increased in proportion to the thickness of the active layer 130, the polarization direction of the active layer 130 is not changed in the second region A2 having a thickness greater than that of the first region A1. In other words, as a first voltage greater than the coercive voltage of the active layer 130 is applied to the first electrode 110 and the second electrode 120, the active layer 130 may be polarized in a second direction different from the first direction only in the first region A1. For example, the first direction may be opposite to the second direction.

When polarization directions in the first region A1 and the second region A2 are opposite to each other, a unit lattice structure of the active layer 130 is locally changed at a boundary between the first region A1 and the second region A2, and thus an electrical polarization different from the first region A1 and the second region A2 may occur. Therefore, free electrons may be accumulated at the boundary between the first region A1 and the second region A2, and thus a variable channel C through which a current may flow may be formed.

Since the variable channel C is formed at the boundary between the first region A1 and the second region A2 and the first region A1 is changed according to the area of the first surface S1, a position at which the variable channel C is formed may also be adjusted according to the area of the first surface S1.

Meanwhile, when a second voltage for returning the polarization direction of the first region A1 is applied to the first electrode 110 and the second electrode 120, the first region A1 may be polarized in the first direction again by a second electric field formed between the first electrode 110 and the second electrode 120. The second voltage may be greater than the coercive voltage of the active layer 130 and may have a polarity opposite to that of the first voltage.

Therefore, a polarization difference between the first region A1 and the second region A2 is eliminated.

When the polarization difference between the first region A1 and the second region A2 is eliminated, the variable channel C between the first region A1 and the second region A2 disappears. This state is the same as the state shown in FIG. 1. In other words, since the first electrode 110 and the second electrode 120 are insulated from each other by the active layer 130, even when a voltage is applied between the first electrode 110 and the second electrode 120, no current flows between the first electrode 110 and the second electrode 120.

Therefore, a current flow of the electronic device 100 may be controlled by controlling a voltage applied to the first electrode 110 and the second electrode 120, and the electronic device 100 may be used for various purposes by controlling the current flow.

For example, the electronic device 100 may be used as a non-volatile memory. In more detail, as shown in FIG. 2, after the polarization direction of the first region A1 is changed by applying the first voltage higher than the coercive voltage of the active layer 130 to the first electrode 110 and the second electrode 120, even when no voltage is applied to the first electrode 110 and the second electrode 120, the polarization direction of the first region A1 is maintained without being changed. This state may be understood that a logic value '1' is input.

Meanwhile, since the variable channel C is formed when the polarization direction of the first region A1 is changed, when a read voltage is applied between the first electrode 110 and the second electrode 120, a current may easily flow, and thus a logic value '1' may be read. Here, in order to prevent polarization of the first region A1 from being affected by the read voltage, the read voltage may be lower than the coercive voltage of the active layer 130.

Also, when the second voltage is applied to the first electrode 110 and the second electrode 120 in order to return the polarization direction of the first region A1, the polarization directions of the first region A1 and the second region A2 become the same, and this state may be understood that a logic value '0' is input.

Also, when the polarization directions of the first region A1 and the second region A2 are the same, the variable channel C disappears between the first region A1 and the second region A2, and thus, even when a voltage is applied between the first electrode 110 and the second electrode 120, no current flows between the first electrode 110 and the second electrode 120. Therefore, a logic value '0' may be read.

In other words, when the electronic device 100 according to the present disclosure is used as a memory, the polarization state of the first region A1 may be selectively changed by applying a voltage to the first electrode 110 and the second electrode 120, and logic values "1" and "0" may be read by measuring a current flowing through the variable channel C that is formed or disappears according to the change in polarization state, and thus a data writing speed and a data reproducing speed may be improved as compared to an existing method of measuring residual polarization of domains.

Also, according to the present disclosure, the variable channel C formed by applying an electric field may be formed only in a certain region. Therefore, the variable channel C is formed only at a limited position without increasing or expanding a domain region in which a polarization state is changed in proportion to an application time of an electric field, and thus it is not necessary to consider the application time of an electric field when the variable channel C is applied to a non-volatile memory.

Also, since the variable channel C is formed as the shortest distance between the first electrode 110 and the second electrode 120 in a state in which the first electrode 110 and the second electrode 120 are stacked, the size of a device may be reduced for larger integration. Also, since the magnitudes of currents flowing when reading the logic value '1' and the logic value '0' differ, readability of data may be improved.

Also, the electronic device 100 according to the present disclosure may configure a circuit unit generating and transmitting various signals and may also be used as a switching device. For example, the ON/OFF of a current flow may be controlled through formation and disappearing of the variable channel C. Also, since the electronic device 100 according to the present disclosure may be applied to a portion needing control of an electrical signal in a simple structure, the electronic device 100 may be applied to various fields like a variable circuit, a CPU, and a biochip.

In another example, the electronic device 100 according to the present disclosure may be used in a capacitor capable of variously forming current path control regions. For example, when a distance between the first electrode 110 and the second electrode 120 facing each other is variously formed, the position of the variable channel C may be variously adjusted according to the magnitude of an electric field applied to the first electrode 110 and the second electrode 120, and thus a current path control regions may be variously formed in a capacitor.

Figure 3:
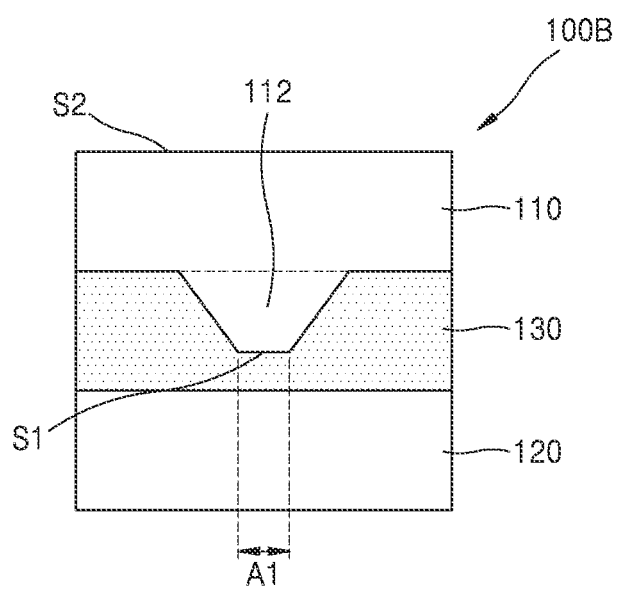
FIG. 3 is a schematic cross-sectional view of another example of the electronic device of FIG. 1.
Figure 4:
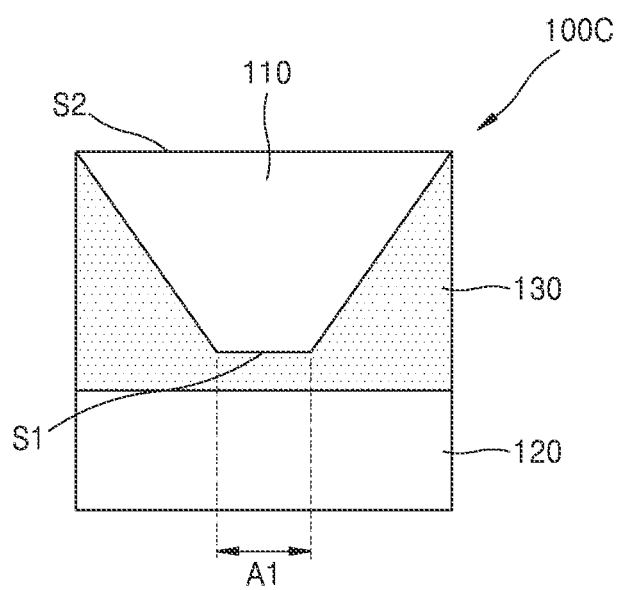
FIG. 4 is a schematic cross-sectional view of another example of the electronic device of FIG. 1.
Figure 5:
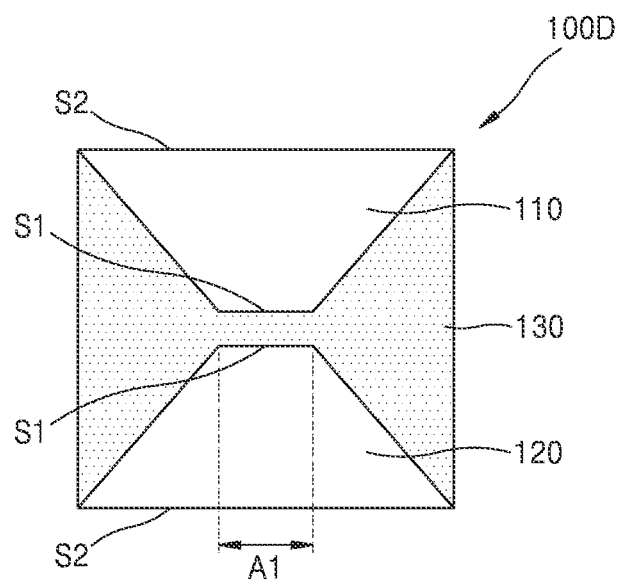
FIG. 5 is a schematic cross-sectional view of another example of the electronic device of FIG. 1.

FIGS. 3 to 5 are schematic cross-sectional views of other examples of the electronic device of FIG. 1.

First, referring to FIG. 3, an electronic device 100B may include the first electrode 110, the second electrode 120 facing the first electrode 110, and the active layer 130 interposed between the first electrode 110 and the second electrode 120, wherein at least one of the first electrode 110 and the second electrode 120 may include the first surface S1 that is closest to the active layer 130 and the second surface S2 that is farthest from the active layer 130. Here, a cross-sectional horizontal area of the first surface S1 may be smaller than a cross-sectional horizontal area of the second surface S2.

For example, as shown in FIG. 3, the first electrode 110 may include the protrusion 112 protruding toward the second electrode 120. Also, at least a portion of the protrusion 112 may have a tapered shape. The tapered portion may include the first surface S1. For example, the protrusion 112 may have a cone-like shape. However, the shape of the horizontal cross-section of the protrusion 112 is not limited to a circular shape and may vary, e.g., triangular shapes, rectangular shapes, or polygonal shapes.

As described above, when the protrusion 112 has a tapered shape including the first surface S1, when a voltage for changing the polarization of the first region A1 is applied between the first electrode 110 and the second electrode 120, an electric field may be concentrated between the first surface S1 and the second electrode 120, and thus the polarization of the first region A1 may be changed more rapidly and effectively.

FIG. 4 shows an electronic device 100C having a structure in which the first electrode 110 has a tapered shape, similar to FIG. 3. However, FIG. 4 shows an example in which the first electrode 110 has an overall tapered shape.

Also, FIG. 5 shows an example in which both the first electrode 110 and the second electrode 120 have tapered shapes. In detail, in an electronic device 100D of FIG. 5, the first electrode 110 and the second electrode 120 may include the first surface S1 and the second surface S2, respectively, and the first region A1 of the active layer 130 may be partitioned between the first surface S1 of the first electrode 110 and the first surface S1 of the second electrode 120. Here, the first surface S1 of the first electrode 110 and the first surface S1 of the second electrode 120 facing each other may have the same area for effective field induction.

FIGS. 6 to 11 are schematic cross-sectional views of other examples of the electronic device of FIG. 1. Although FIGS. 6 through 11 show shapes of the protrusion 112, as described above, according to the present disclosure, a first electrode (110 of FIG. 6) and/or a second electrode (120 of FIG. 6) may have an overall tapered shape, and the protrusion 112 may be formed as a single body with the first electrode (110 of FIG. 6) and/or the second electrode (120 of FIG. 6). Therefore, it may be hereinafter understood that the protrusion 112 is a part of the first electrode (110 of FIG. 6) and/or the second electrode (120 of FIG. 6).

Figure 6:
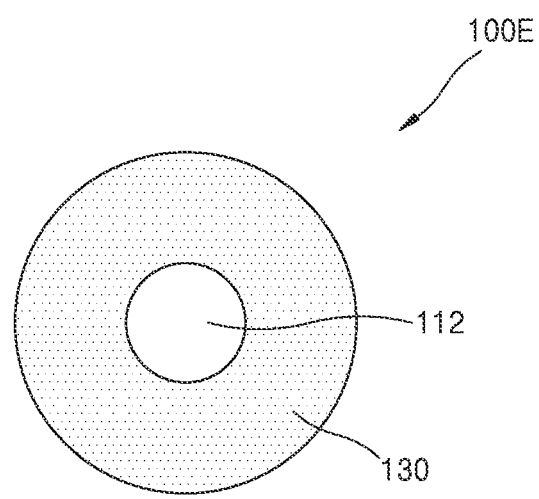
FIG. 6 is a schematic cross-sectional view of an example of a cross-section I-I' of the electronic device of FIG. 1.
Figure 7:
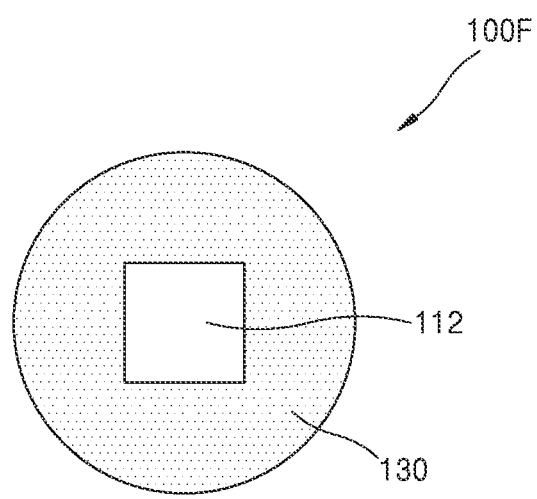
FIG. 7 is a schematic cross-sectional view of another example of a cross-section I-I' of the electronic device of FIG. 1.
Figure 8:
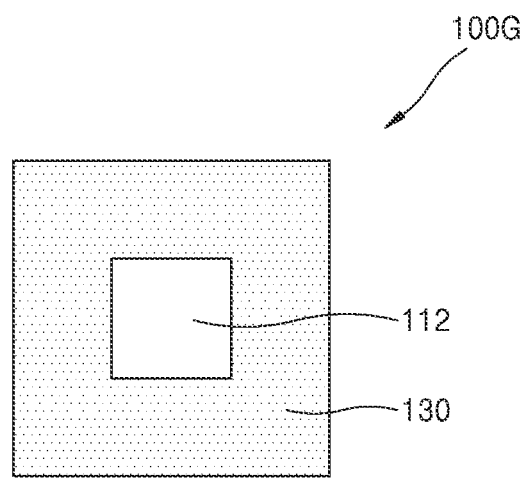
FIG. 8 is a schematic cross-sectional view of another example of a cross-section I-I' of the electronic device of FIG. 1.

FIG. 6 shows an example in which both the protrusion 112 and the active layer 130 of an electronic device 100E have circular cross-sections. FIG. 7 shows an example in which the protrusion 112 of an electronic device 100F has a rectangular cross-section and the active layer 130 has a circular cross-section. FIG. 8 shows an example in which both the protrusion 112 and the active layer 130 of an electronic device 100G have rectangular cross-sections. In other words, shapes of the protrusion 112 and the active layer 130 are not limited to the above-described shapes and may vary. Also, as shown in FIGS. 9 and 10, a plurality of protrusions may be provided.

Figure 9:
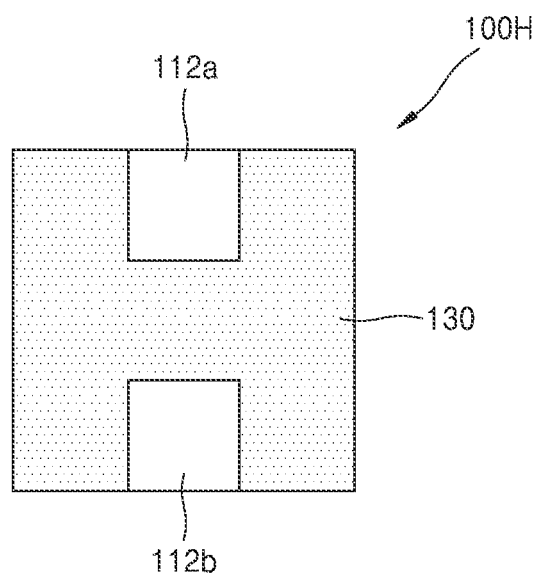
FIG. 9 is a schematic cross-sectional view of another example of a cross-section I-I' of the electronic device of FIG. 1.

FIG. 9 shows an electronic device 100H including a first protrusion 112a and a second protrusion 112b. The first protrusion 112a and the second protrusion 112b may be apart from each other, and different voltages may be applied thereto. For example, when the second electrode (120 of FIG. 1) is formed as a single body therewith, two variable channels (C of FIG. 2) may be formed. Therefore, when the electronic device 100H is used as a memory, logic values "0", "1", "2", and "3" may be recorded and read.

Figure 10:
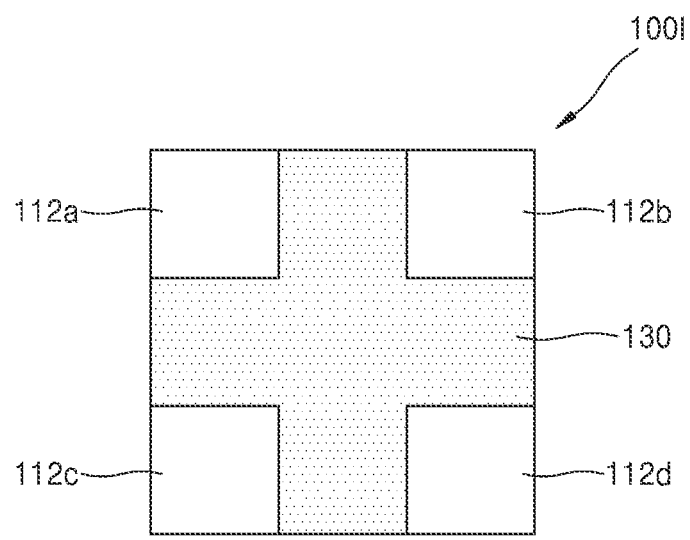
FIG. 10 is a schematic cross-sectional view of another example of a cross-section I-I' of the electronic device of FIG. 1.

FIG. 10 shows an electronic device 100i including the first protrusion 112a, the second protrusion 112b, a third protrusion 112c, and a fourth protrusion 112d. The first protrusion 112a, the second protrusion 112b, the third protrusion 112c, and the fourth protrusion 112d may be electrically separated from one another. Also, the second electrode (120 of FIG. 1) facing the first protrusion 112a, the second protrusion 112b, the third protrusion 112c, and the fourth protrusion 112d may be separated. Therefore, when the electronic device 100H is used as a memory, an amount of processing data of the electronic device 100H may increase.

Figure 11:
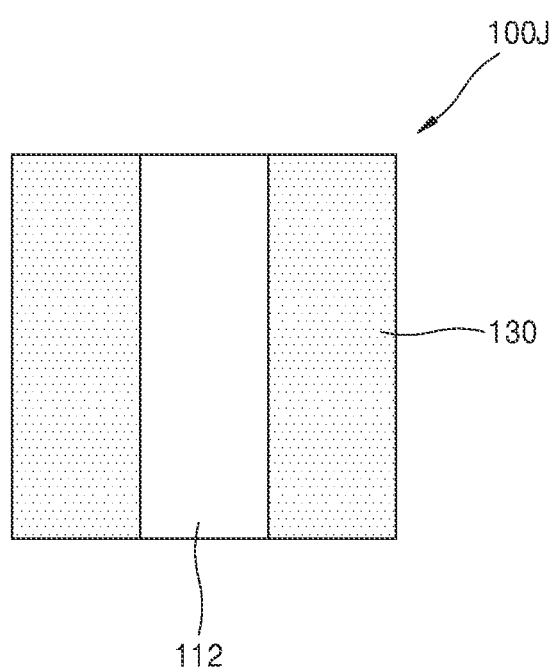
FIG. 11 is a schematic cross-sectional view of another example of a cross-section I-I' of the electronic device of FIG. 1.

FIG. 11 shows an example in which the protrusion 112 of an electronic device 100J extends in one direction. In other words, since the length of the protrusion 112 is the same as the length of the active layer 130, the variable channel (C of FIG. 2) may not be formed to surround the protrusion 112, but may be formed in parallel with the protrusion 112 at both edges of the protrusion 112.

While the present disclosure has been described with reference to exemplary embodiments, it is to be understood that the present disclosure is not limited to the disclosed example embodiments, but, on the contrary, is intended to cover various modifications and equivalent arrangements included within the spirit and scope of the appended claims. Accordingly, the true scope of protection of the present disclosure should be determined by the technical idea of the appended claims.

The invention claimed is:

1. An electronic device comprising:
a first electrode;
a second electrode facing the first electrode; and
an active layer between the first electrode and the second electrode, wherein:
at least one of the first electrode and the second electrode comprises a first surface that is closest to the active layer and a second surface that is farthest from the active layer,
a size of a cross-sectional horizontal area at the first surface is smaller than a size of a cross-sectional horizontal area at the second surface,
the active layer comprises a first region, which vertically overlaps the first surface, and a second region outside the first region, and a thickness of the active layer in the first region is smaller than a thickness of the active layer in the second region,
at least one of the first electrode and the second electrode comprises at least two protrusions protruding in a direction toward the other electrode,
the size of the cross-sectional horizontal area at the first surface is equal to an area of an end portion of the at least two protrusions,
the active layer includes a spontaneously polarizable material,
a polarization region is formed in the active layer through an electric field applied between the first electrode and the second electrode,
the polarization region includes a first portion corresponding to the first region and a second portion corresponding to the second region,
a variable channel corresponds to a boundary between the first portion corresponding to the first region and the second portion corresponding to the second region,
the variable channel has a lower electrical resistance than an adjacent region,
the first portion of the polarization region corresponding to the first region and the second portion of the polarization region corresponding to the second region are respectively formed to correspond to the total thickness in the thickness direction of the active layer, and
the variable channel is formed to correspond to the entire thickness of the active layer corresponding to the first region in the thickness direction.

2. The electronic device of claim 1, wherein at least one of the first electrode and the second electrode has a tapered shape.

3. The electronic device of claim 1, wherein the active layer is polarized in a first direction in the second region, and the first region is selectively polarized in the first direction or a second direction different from the first direction due to an application of a voltage to the first electrode and the second electrode.

4. The electronic device of claim 3, wherein when the first region is polarized in the second direction, a variable channel through which electrons move is formed between the first region and the second region.

5. The electronic device of claim 4, wherein the variable channel disappears when the first region is polarized in the first direction.

6. A method of controlling an electric current path by using an electric field in an electronic device comprising a first electrode and a second electrode facing each other, and an active layer which is between the first electrode and the second electrode and polarized in a first direction, wherein at least one of the first electrode and the second electrode comprises at least two protrusions protruding in a direction toward the other electrode, the method comprising:
generating a first electric field between the first electrode and the second electrode by applying a first voltage between the first electrode and the second electrode;
dividing the active layer into a first region and a second region which have different polarizations by changing a polarization direction of a portion of the active layer by using the first electric field; and
forming a channel through which a current flows at a boundary between the first region and the second region, wherein at least one of the first electrode and the second electrode comprises a first surface that is closest to the active layer and a second surface that is farthest from the active layer, and a size of a cross-sectional horizontal area at the first surface is smaller than a size of a cross-sectional horizontal area at the second surface,
the first region is a region overlapping the first surface in a vertical direction, and a thickness of the active layer in the first region is smaller than a thickness of the active layer in the second region,
the active layer includes a spontaneously polarizable material,
a polarization region is formed in the active layer through an electric field applied between the first electrode and the second electrode,
the polarization region includes a first portion corresponding to the first region and a second portion corresponding to the second region,
a variable channel corresponds to a boundary between the first portion corresponding to the first region and the second portion corresponding to the second region,
the variable channel has a lower electrical resistance than an adjacent region,
the first portion of the polarization region corresponding to the first region and the second portion of the polarization region corresponding to the second region are respectively formed to correspond to the total thickness in the thickness direction of the active layer, and
the variable channel is formed to correspond to the entire thickness of the active layer corresponding to the first region in the thickness direction.

7. The method of claim 6, wherein the channel is formed as a shortest distance between the first electrode and the second electrode.

8. The method of claim 6, wherein, when the first voltage is applied between the first electrode and the second electrode, the second region maintains polarization in the first direction.

9. The method of claim 6, further comprising generating a second electric field between the first electrode and the second electrode by applying a second voltage for returning the polarization direction of the first region between the first electrode and the second electrode,
wherein the channel disappears as the second voltage is applied.

10. The method of claim 6, wherein:
applying a second voltage between the first electrode and the second electrode to set a logic value of the electronic device to one of at least four logic values.

* * * * *